(12) United States Patent
Yuh

(10) Patent No.: US 11,881,242 B2
(45) Date of Patent: Jan. 23, 2024

(54) FERROELECTRIC FIELD-EFFECT TRANSISTOR (FEFET) MEMORY

(71) Applicant: Taiwan Semiconductor Manufacturing Company, Ltd., Hsinchu (TW)

(72) Inventor: Perng-Fei Yuh, Walnut Creek, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/816,143

(22) Filed: Jul. 29, 2022

(65) Prior Publication Data

US 2022/0366956 A1 Nov. 17, 2022

Related U.S. Application Data

(63) Continuation of application No. 17/229,194, filed on Apr. 13, 2021, now Pat. No. 11,450,370.

(60) Provisional application No. 63/041,515, filed on Jun. 19, 2020.

(51) Int. Cl.
 - *G11C 11/22* (2006.01)
 - *G11C 11/56* (2006.01)
 - *H10B 51/00* (2023.01)

(52) U.S. Cl.
 CPC ........ *G11C 11/223* (2013.01); *G11C 11/2259* (2013.01); *G11C 11/2273* (2013.01); *G11C 11/2275* (2013.01); *G11C 11/5657* (2013.01); *H10B 51/00* (2023.02)

(58) Field of Classification Search
 CPC .............. G11C 11/223; G11C 11/2259; G11C 11/2273; G11C 11/2275
 See application file for complete search history.

(56) References Cited

U.S. PATENT DOCUMENTS

| | | |
|---|---|---|
| 2006/0049440 A1 | 3/2006 | Bruchhaus |
| 2009/0040808 A1* | 2/2009 | Krieger ............. H01L 29/78391 257/295 |
| 2017/0162250 A1 | 6/2017 | Slesazeck et al. |
| 2018/0082729 A1 | 3/2018 | Slesazeck et al. |
| 2018/0122478 A1 | 5/2018 | Morris et al. |
| 2018/0240804 A1 | 8/2018 | Yoo |
| 2019/0273087 A1 | 9/2019 | Morris et al. |
| 2019/0304986 A1 | 10/2019 | Dong et al. |
| 2020/0105897 A1* | 4/2020 | Hsu ................... H01L 29/78391 |
| 2020/0203381 A1 | 6/2020 | Rabkin et al. |
| 2021/0375891 A1* | 12/2021 | Young ................. H01L 23/5226 |

FOREIGN PATENT DOCUMENTS

| | | |
|---|---|---|
| CN | 107170812 A1 | 9/2017 |
| CN | 106537509 A | 2/2019 |

OTHER PUBLICATIONS

Chinese Office Action, Application No. 202110685964.4, dated Nov. 17, 2023, 12 pages.

* cited by examiner

*Primary Examiner* — Han Yang
(74) *Attorney, Agent, or Firm* — Merchant & Gould P.C.

(57) ABSTRACT

A memory device includes a plurality of memory cells. Each memory cell includes a multi-gate FeFET that has a first source/drain terminal, a second source/drain terminal, and a gate with a plurality of ferroelectric layers configured such that each of the ferroelectric layers has a respective unique switching E-field.

20 Claims, 13 Drawing Sheets

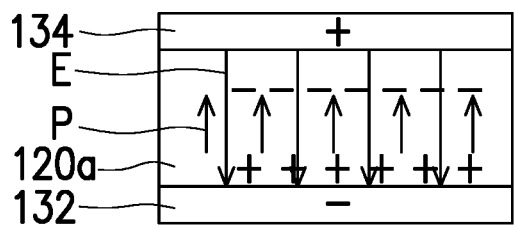
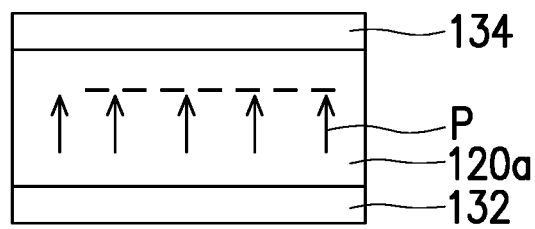
FIG. 3  FIG. 4
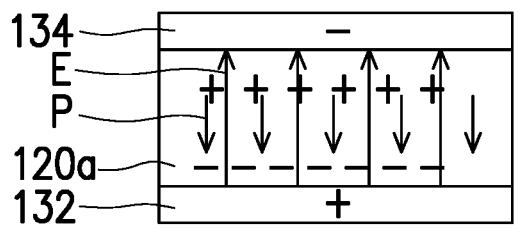
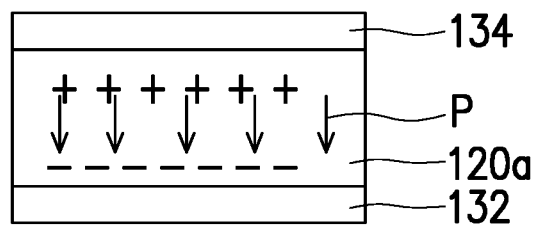
FIG. 5  FIG. 6
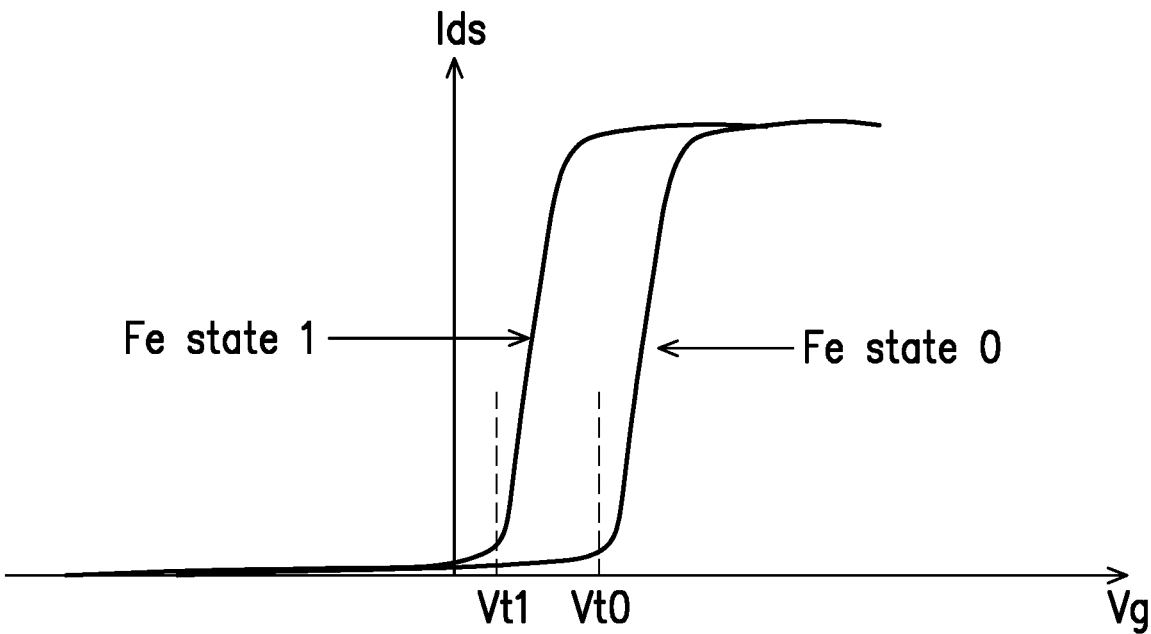
FIG. 7

FERROELECTRIC FIELD-EFFECT TRANSISTOR (FEFET) MEMORY

CROSS REFERENCE TO RELATED APPLICATION

This application is a continuation of U.S. patent application Ser. No. 17/229,194, filed Apr. 13, 2021, now U.S. Pat. No. 11,450,370, which claims the benefit of U.S. Provisional Application No. 63/041,515, filed Jun. 19, 2020, and titled "Ferroelectric Field-Effect Transistor (FeFET) Memory," the disclosures of which are hereby incorporated herein by reference.

BACKGROUND

A ferroelectric field-effect transistor (FeFET) is a type of field-effect transistor that includes a ferroelectric material sandwiched between the gate electrode and source-drain conduction region of the device. Permanent electrical field polarization in the ferroelectric causes this type of device to retain the transistor's state (on or off) in the absence of an electrical bias. FeFET based devices are used in FeFET memory or FeRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIGS. 3-6 are block diagrams of a ferroelectric gate structure illustrating polarization states shown in FIG. 2 in accordance with disclosed embodiments.

FIG. 7 is a chart illustrating two threshold voltage (Vt) levels for a single ferroelectric gate layer of a multiple gate FeFET in accordance with disclosed embodiments.

DETAILED DESCRIPTION

Figure 1A:
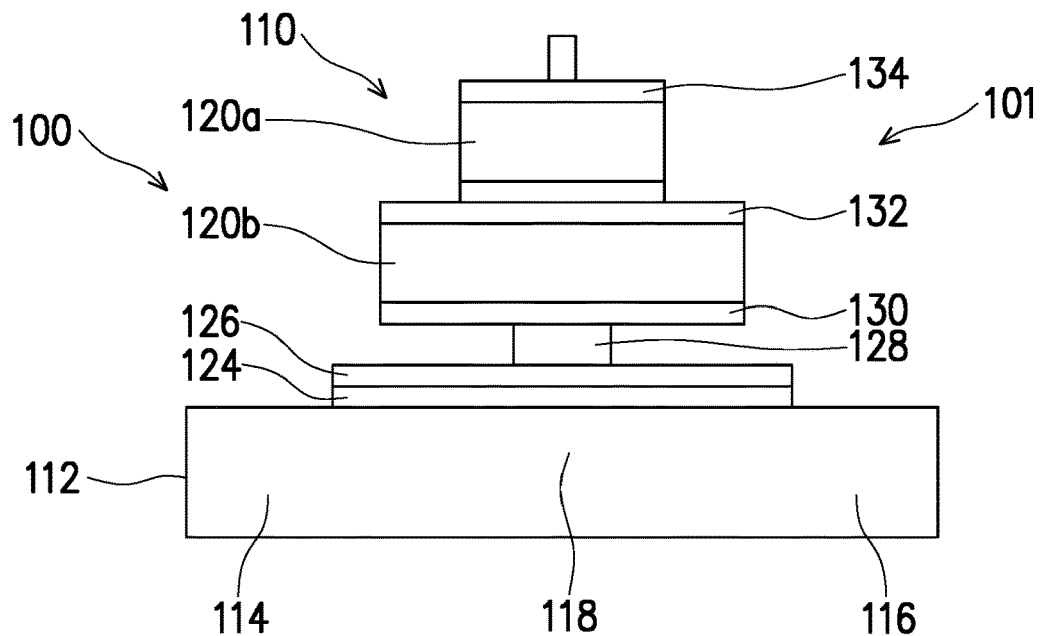
FIG. 1A is a block diagram schematically illustrating an example of a multi-bit memory cell in accordance with disclosed embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric field-effect transistor (FeFET) is a type of field-effect transistor that includes a ferroelectric material sandwiched between the gate electrode and source-drain conduction region of the device. Permanent electrical field polarization in the ferroelectric causes this type of device to retain the transistor's state (on or off) in the absence of an electrical bias. FeFET based devices are used in FeFET memory or FeRAM, among other things.

The ferroelectric material generally replaces the gate oxide of the FET. The switching is caused by applying an electrical field via a voltage between the transistor gate and transistor channel. Specially, for n-channel transistors, ferroelectric switching after application of a sufficiently high positive voltage pulse causes a shift of the threshold voltage (Vt) to lower threshold voltage values. For p-channel transistors a negative voltage pulse causes a shift of the threshold voltage to higher threshold voltage values.

A common type of integrated circuit memory is a static random access memory (SRAM) device. A typical SRAM memory device has an array of memory cells. Each memory cell uses six transistors, for example, connected between an upper reference potential and a lower reference potential (typically ground) such that one of two storage nodes can be occupied by the information to be stored, with the complementary information stored at the other storage node. While SRAM maintains data in the memory array without the need to be refreshed when powered, it is volatile in that data is eventually lost when the memory is not powered. Further, the typical SRAM construction consumes a relatively large area.

FeRAM has generally has a smaller area that may be about 25% smaller in size as compared to conventional SRAM. Some disclosed embodiments provide a memory cell that is capable of storing multiple bits of data, thus further reducing area required for memory cells. More particularly, disclosed examples include a memory cell that has a multi-gate FeFET with a source, a drain and a gate, where the gate has a plurality of ferroelectric layers configured such that each of the ferroelectric layers has a respective unique switching E-field. Some examples may include vertical stacking of ferroelectric layers having different sizes, and thus each of the ferroelectric layers has a different switching E field. This in turn provides a FeFET device that has more Vt values than a conventional FeFET memory cell. Accordingly, multiple level write and multiple level read operations are provided, allowing a memory cell with multiple memory bits that occupies similar area as a single bit FET cell. This allows a reduction of the effective device area per memory bit. Such multiple ferroelectric layers can be provided the back end of the line (BEOL) or middle end of the line (MEOL) processes providing manufacturing flexibility.

FIG. 1A illustrates aspects of a multi-bit memory cell 100 in accordance with disclosed examples. The multi-bit memory cell 100 includes a multi-gate FeFET 101 having a substrate 112 that may be, for example, a semiconductor layer of a semiconductor-on-insulator (SOI) substrate or a bulk semiconductor substrate. The FeFET 101 comprises a pair of source/drain regions 114, 116 that have a first doping type and are arranged within the substrate 112, respectively on opposite sides of a channel region 118. The channel region 118 has a second doping type opposite the first doping and is arranged in the substrate 112 laterally between the source/drain regions 114, 116. The first and second doping types may, for example, respectively be n-type and p-type, or vice versa.

Figure 1B:
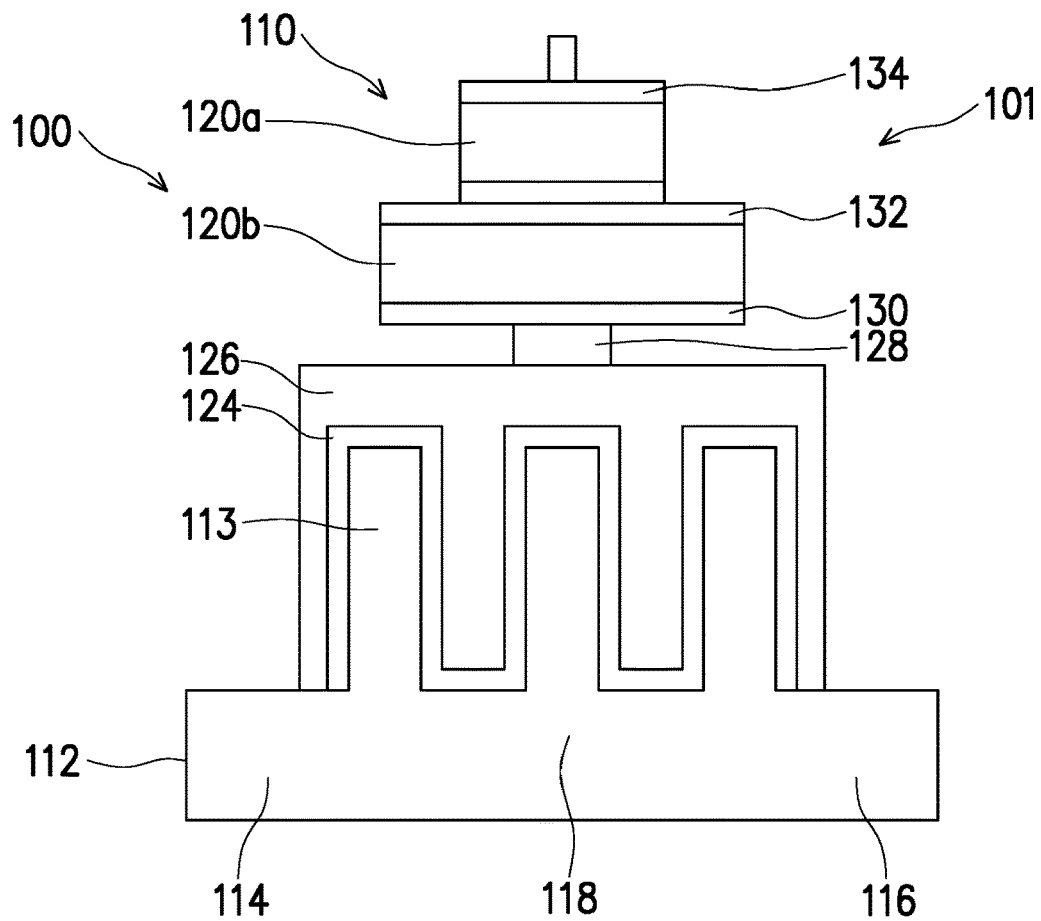
FIG. 1B is a block diagram schematically illustrating alternative aspects of the multi-bit memory cell shown in FIG. 1A in accordance with disclosed embodiments.

FIG. 1B illustrates an alternative embodiment in which the substrate 112 defines fins 113 extending therefrom. The source/drain regions 114, 116 have the first doping type and are arranged within the substrate 112, respectively on opposite sides of the channel region 118 having the second doping type opposite the first doping type.

The FeFET 101 includes a gate 110 that has a gate metal layer 126 arranged over the substrate 112 laterally between the source/drain regions 114, 116, and is spaced from the substrate 112 by a non-ferroelectric gate oxide 124. In some examples, the non-ferroelectric gate oxide material is silicon dioxide. The gate electrode 126 is conductive and may comprise metal, doped polysilicon, or a combination thereof. In the illustrated embodiment, the gate electrode 126 is electrically coupled to a BEOL ferroelectric gate structure by a conductive vertical interconnect access (via) 128.

The conductive via 128 may be part of a BEOL interconnect structure arranged over the substrate 112. The interconnect structure may include a multi-layer interconnect (MLI) structure having conductive lines, conductive vias, and/or interposing dielectric layers (e.g., interlayer dielectric (ILD) layers). The interconnect structure may provide various physical and electrical connections, including the gate via 128. The conductive lines may comprise copper, aluminum, tungsten, tantalum, titanium, nickel, cobalt, metal silicide, metal nitride, poly silicon, combinations thereof, and/or other materials possibly including one or more layers or linings. The interposing dielectric layers (e.g., ILD layers) may comprise silicon dioxide, fluorinated silicon glass (FGS), SILK (a product of Dow Chemical of Michigan), BLACK DIAMOND (a product of Applied Materials of Santa Clara, Calif.), and/or other suitable insulating materials. The MLI structure may be formed by suitable processes typical in CMOS fabrication such as CVD, PVD, ALD, plating, spin-on coating, and/or other processes.

The gate 110 of the illustrated FeFET 101 includes a plurality of ferroelectric layers configured such that each of the ferroelectric layers has a respective unique switching E-field. In the illustrate example, the gate 110 includes a first ferroelectric layer 120a and a second ferroelectric layer 120b in a stacked arrangement. A gate metal layer 130 abuts one side of the ferroelectric layer 120b and is connected to the gate electrode 126 by the via 128. A buffer layer 132 is situated between the ferroelectric layer 120a and the ferroelectric layer 120b, with a conductive gate terminal 134 situated on the ferroelectric layer 120a. In alternative embodiments the, ferroelectric layers 120a, 120b are formed directly over the non-ferro gate oxide 124 to form a composite gate structure.

The ferroelectric layers 120a, 120b may be formed in FEOL process layers close to the non-ferroelectric gate oxide 124, or as shown in the example of FIG. 1, the ferroelectric layers 120a, 120b are formed in MEOL or BEOL processes and are connected to the gate metal layer 126 by the via 128. In still further examples, ferroelectric layers 120a, 120b are formed in MEOL or BEOL processes for FinFET, nano sheet, or other gate all around technologies.

Figure 1C:
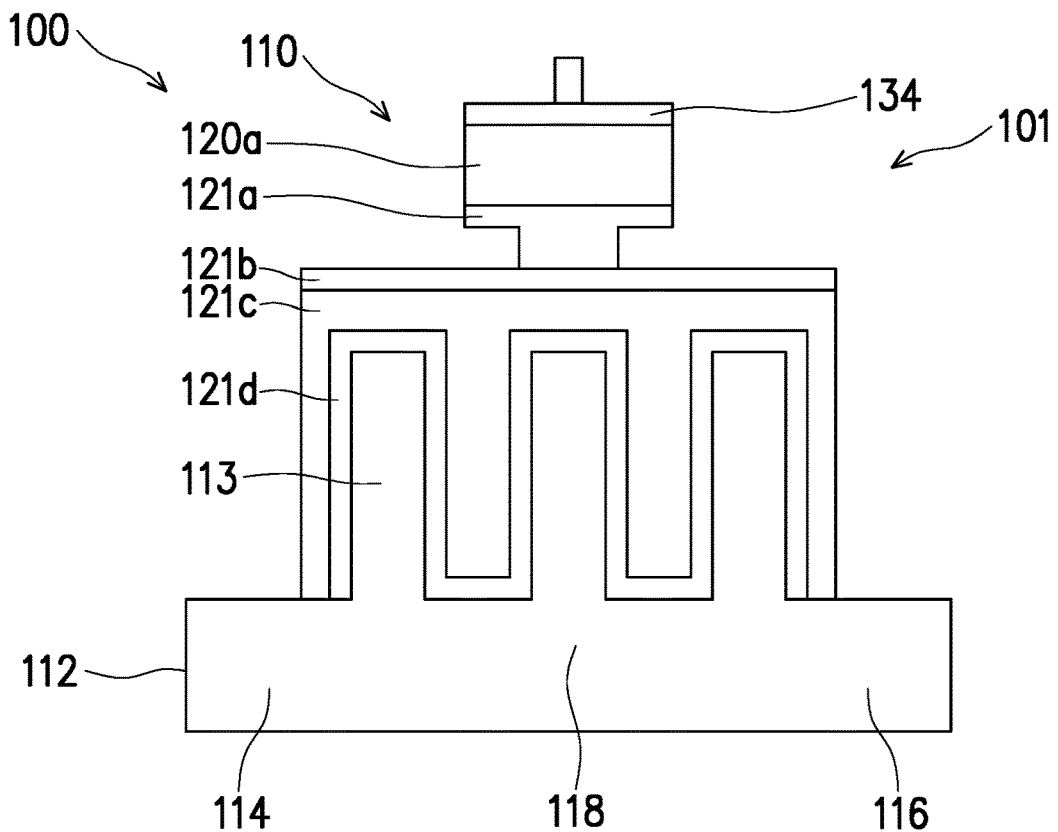
FIG. 1C is a block diagram schematically illustrating alternative aspects of the multi-bit memory cells shown in FIGS. 1A and 1B in accordance with disclosed embodiments.

In FIGS. 1a and 1b, the ferroelectric layers 120a and 120b are both planar structures. Other embodiments may employ ferroelectric layers having other shapes and arrangements. FIG. 1C illustrates an example of the FeFET 101 that includes the substrate 112 with fin structures 113 as shown in the example of FIG. 1B. FIG. 1C further illustrates the planar ferroelectric layer 120, as well as several additional example ferroelectric layers. In addition to the planar ferroelectric layer 120a, FIG. 1C illustrates example ferroelectric layers including a T-shaped ferroelectric layer 121a, a thin planar ferroelectric layer 121b, a thick fin ferroelectric layer 121c, and a thinner ferroelectric layer 121d. For simplicity, other structures of the multi-bit memory cell 100 are omitted in FIG. 1C.

Figure 2:
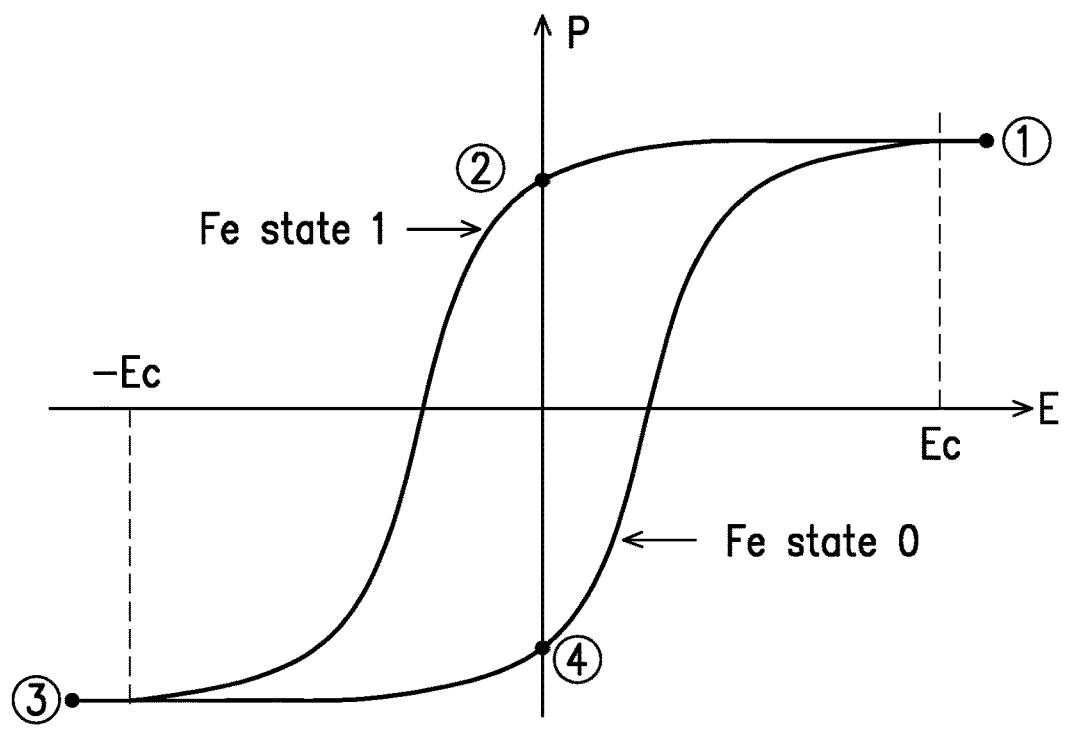
FIG. 2 is a chart illustrating a hysteresis curve for ferroelectric material for polarization induced by an applied electrical field in accordance with disclosed embodiments.

A ferroelectric material is an insulator in which the polarization P induced by an applied electrical field E shows a hysteresis curve as shown in FIG. 2. FIG. 2 shows four states when varying an electrical field applied to a ferroelectric layer. FIGS. 3-6 illustrate the four states shown in FIG. 2 for an example of one of the ferroelectric layers 120a positioned between metal layers such as gate terminals 130, 134 and the buffer layer 132. For simplicity, FIGS. 3-6 only show the first ferroelectric layer 120a between the conductive gate terminal 134 and buffer layer 132. FIG. 3 illustrates a positive E field generated by applying a voltage between the top terminal 134 and the lower terminal 132 as indicated by the downwardly pointing arrows, resulting in the polarization P. State 1 shown in FIG. 2 is a case for writing a data 1, where the illustrated polarization P results from an E field higher than a positive critical electrical field Ec. When the applied E field is removed as shown in FIG. 4, the polarization state remains as shown at state 2 in FIG. 2, i.e. the data high or 1 state. To write a data 0, a negative E field lower than a negative critical field −Ec is applied as shown in FIG. 5, reversing the induced polarity P resulting in state 3 shown in FIG. 2. When the external E field is removed as shown in FIG. 6, the ferroelectric state remains at the 0 state.

Thus, the first ferroelectric layer 120a forming one layer of the gate 110 of the FeFET 101 has two threshold voltage (Vt) levels depending on the polarization of the ferroelectric material. FIG. 7 illustrates two Vt levels for a single ferroelectric gate layer, such as the ferroelectric layer 120a or 120b. As shown in FIG. 7, two distinct Vt values are established that correspond to the two states of the ferroelectric gate material described in conjunction with FIGS. 2-5. The Vt1 level corresponds to the 1 state shown in FIG. 3, while the Vt0 level corresponds to the 0 state shown in FIG. 5. Accordingly, a conventional FeFET based memory cell with only one ferroelectric gate layer can store two states of a single memory bit.

Figure 8:
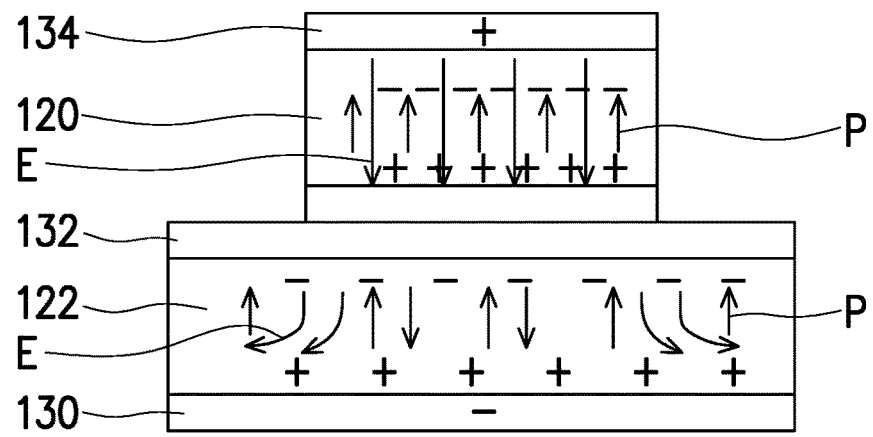
FIG. 8 is a block illustrating a gate structure including two ferroelectric gate layers of a multiple gate FeFET in accordance with disclosed embodiments.
Figure 9:
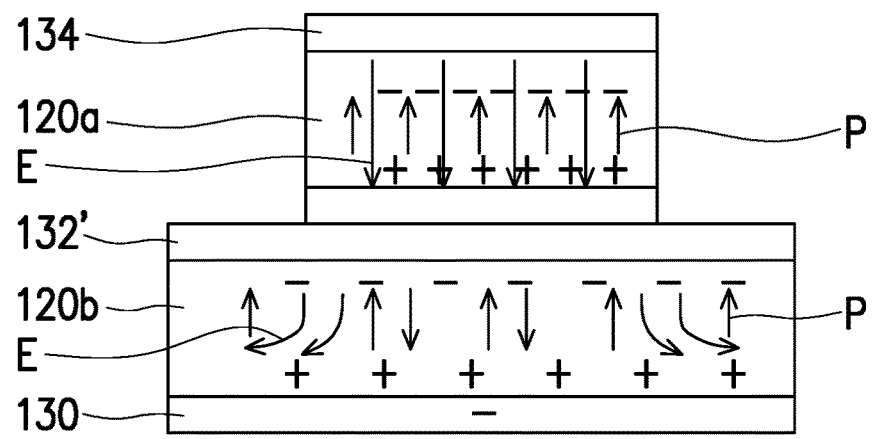
FIG. 9 is a block illustrating an alternative gate structure including two ferroelectric gate layers of a multiple gate FeFET in accordance with disclosed embodiments.

As noted above, the gate 110 of the FeFET 101 illustrated in FIG. 1A has two ferroelectric layers 120a and 120b. FIGS. 8 and 9 illustrate examples of portions of the gate 110, including the first and second ferroelectric layers 120a and 120b, the gate terminals 130 and 134, and the buffer layer 132. In the example of FIG. 8, the buffer layer 132 is formed from metal or another suitable conductive material. FIG. 9 illustrates an alternative embodiment in which the buffer layer 132' is formed of a non-conductive material. As shown in FIG. 8, the voltage applied to the gate terminals 130 and 134 and resulting E field is evenly distributed with the conductive buffer layer 132. With the non-conductive buffer layer 132' shown in FIG. 9, the voltage and resulting E field may curve at the edges of the ferroelectric layer 120a or 120b. In still further embodiments, the buffer layer 132 may be omitted.

Figure 10:
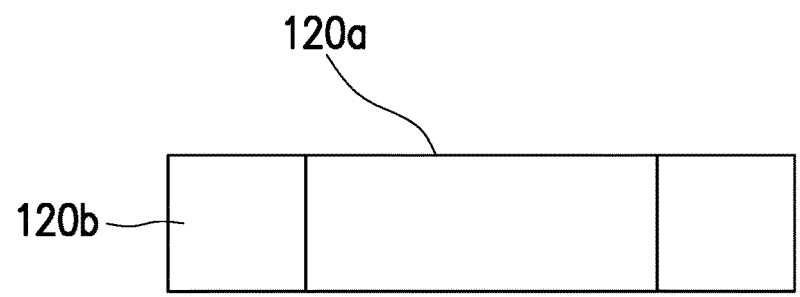
FIG. 10 is a top view illustrating aspects of the gate structure shown in FIGS. 8 and 9 in accordance with disclosed embodiments.

Each of the ferroelectric layers 120a and 120b is configured to have a respective unique switching E-field. In the example shown in FIGS. 8 and 9, the surface area of the planar ferroelectric layers 120a and 120b is different, which results in different switching E fields for the ferroelectric layers 120a and 120b. FIG. 10 is a schematic top view of the ferroelectric layers 120a and 120b, conceptually illustrating the difference in size or surface area, showing the ferroelectric layer 120a having a smaller area than the ferroelectric layer 120b. The illustrated ferroelectric layers 120a and 120b are planar structures and as such, surface area is varied. However, ferroelectric layers having other shapes and areas are within the scope of the disclosure as long as the ferroelectric layers demonstrate different switching E fields.

In general, the ferroelectric layer 120a or 120b with a smaller area will have a larger voltage drop, and thus have a higher switching E field than the layer with larger area. If the two layers have the same thickness and are formed from the same ferroelectric material, then the one with smaller area will switch first, or at a lower voltage level. To switch the layer with larger area, a higher voltage level applied to the gate terminals is required. As described further below, the two ferroelectric layers 120a and 120b with respective different surface areas A1 and A2 result in a FeFET with multiple threshold voltages.

Figure 11:
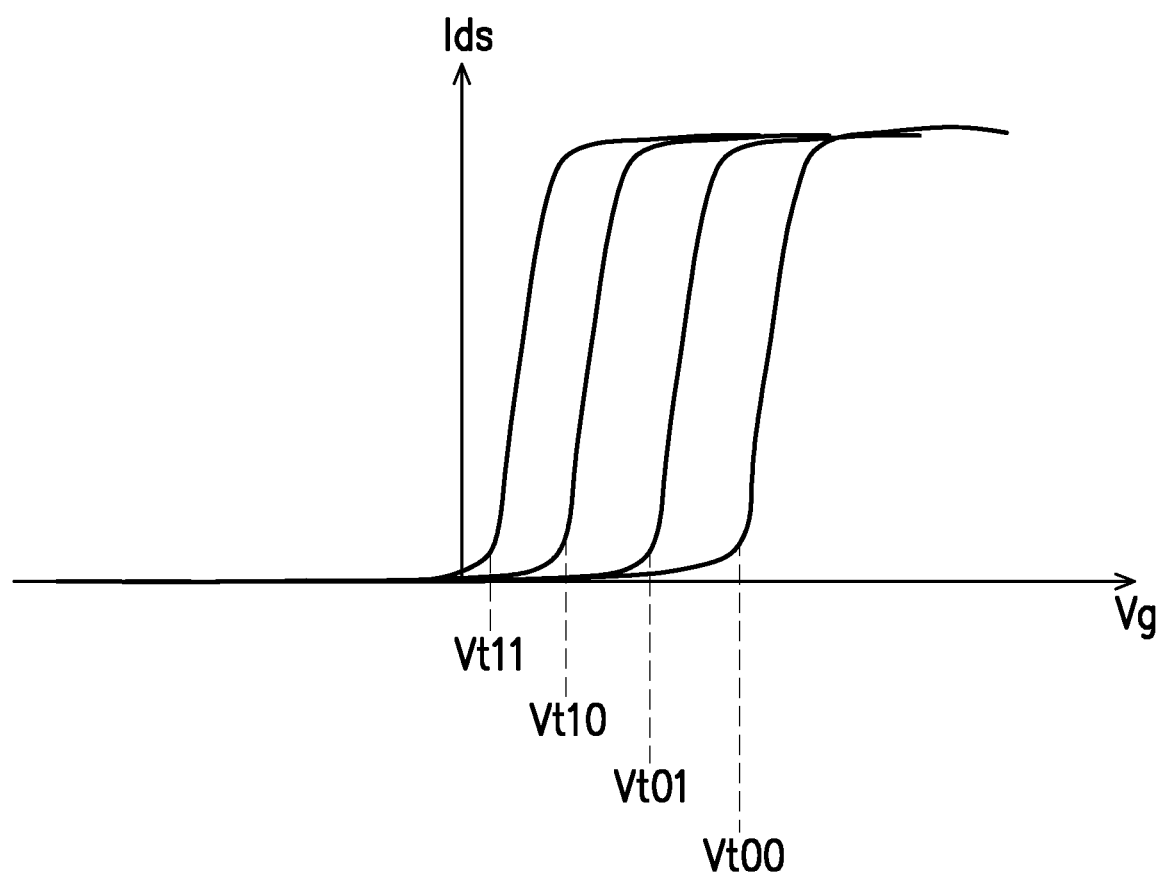
FIG. 11 is a chart illustrating Vt levels for a dual gate FeFET in accordance with disclosed embodiments.
Figure 12:
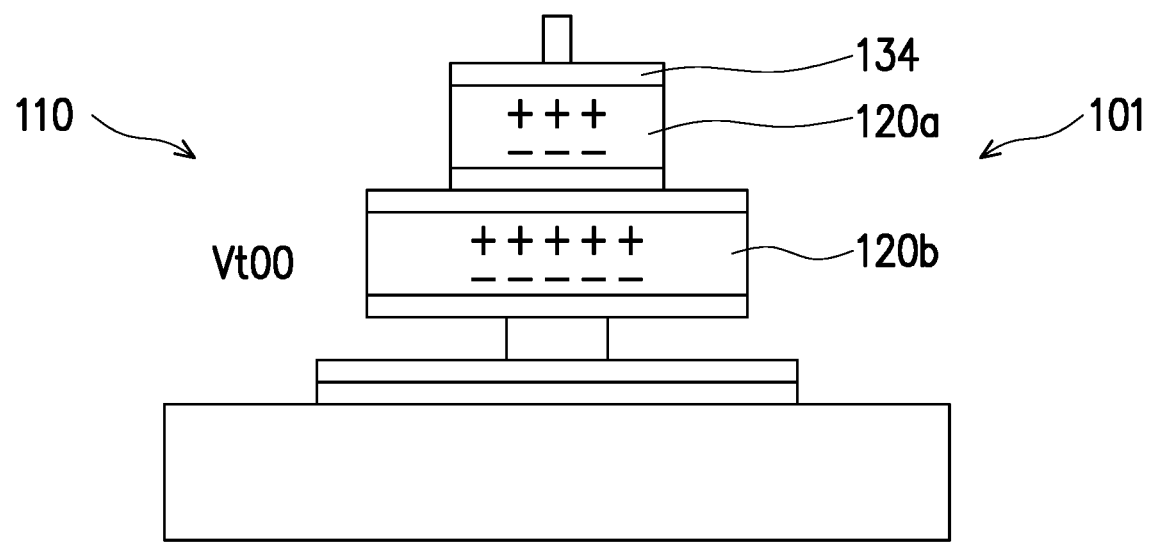
FIGS. 12-15 are block diagrams illustrating portions of the multi-bit memory cell shown in FIG. 1A, showing the polarizations corresponding to the Vt levels shown in FIG. 11 in accordance with disclosed embodiments.
Figure 13:
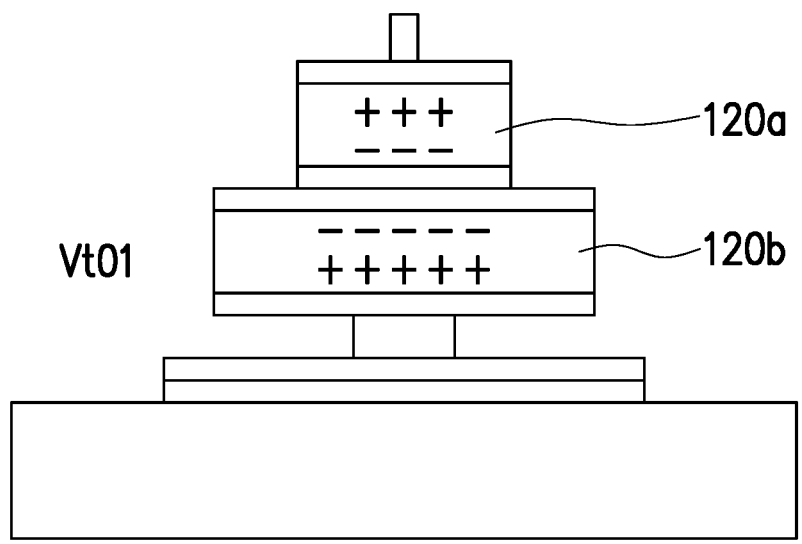
Figure 14:
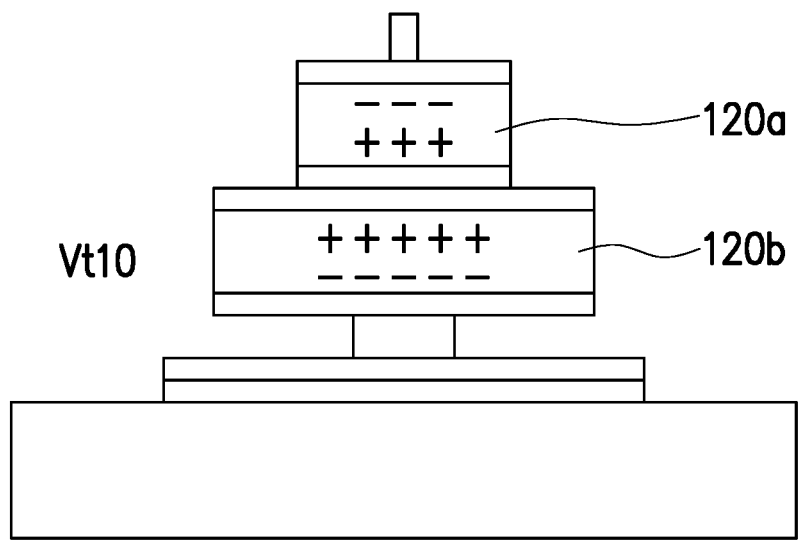
Figure 15:
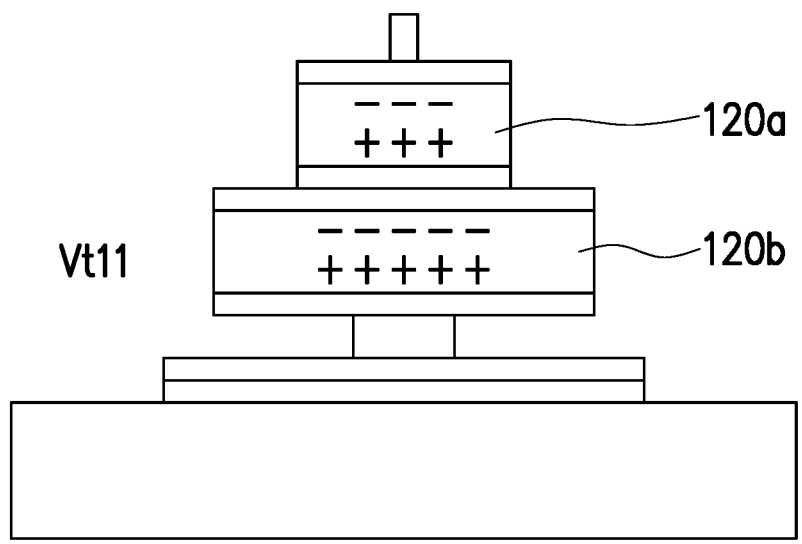

More particularly, the conductive gate terminals 130, 134 and buffer layer 132 are separated by the dielectric ferroelectric layers 120a and 120b, and thus form capacitors C1 and C2. The different surface areas of the respective ferroelectric layers 120a and 120b results in respective different switching E fields for these ferroelectric layers. As such, the individual ferroelectric layers 120a and 120b of the gate 110 may be individually controlled to provide four different Vt levels as shown in FIG. 11, allowing four different data states to be stored by the multi-bit memory cell 100 including the FeFET 101. FIGS. 12-15 illustrate the polarization of each of the ferroelectric layers 120a and 120b corresponding to the four Vt levels shown in FIG. 11. FIG. 12 illustrates polarization for the Vt00 threshold voltage, where both of the ferroelectric layers 120a and 120b are in the 0 state. FIG. 13 illustrates polarization for the Vt01 threshold voltage, where the first ferroelectric layer 120a is in the 0 state and the second ferroelectric layer 120b is in the 1 state. FIG. 14 illustrates polarization for the Vt10 threshold voltage, where the first ferroelectric layer 120a is in the 1 state and the second ferroelectric layer 120b is in the 0 state. FIG. 15 illustrates polarization for the Vt11 threshold voltage, where both of the ferroelectric layers 120a and 120b are in the 1 state.

Figure 16:
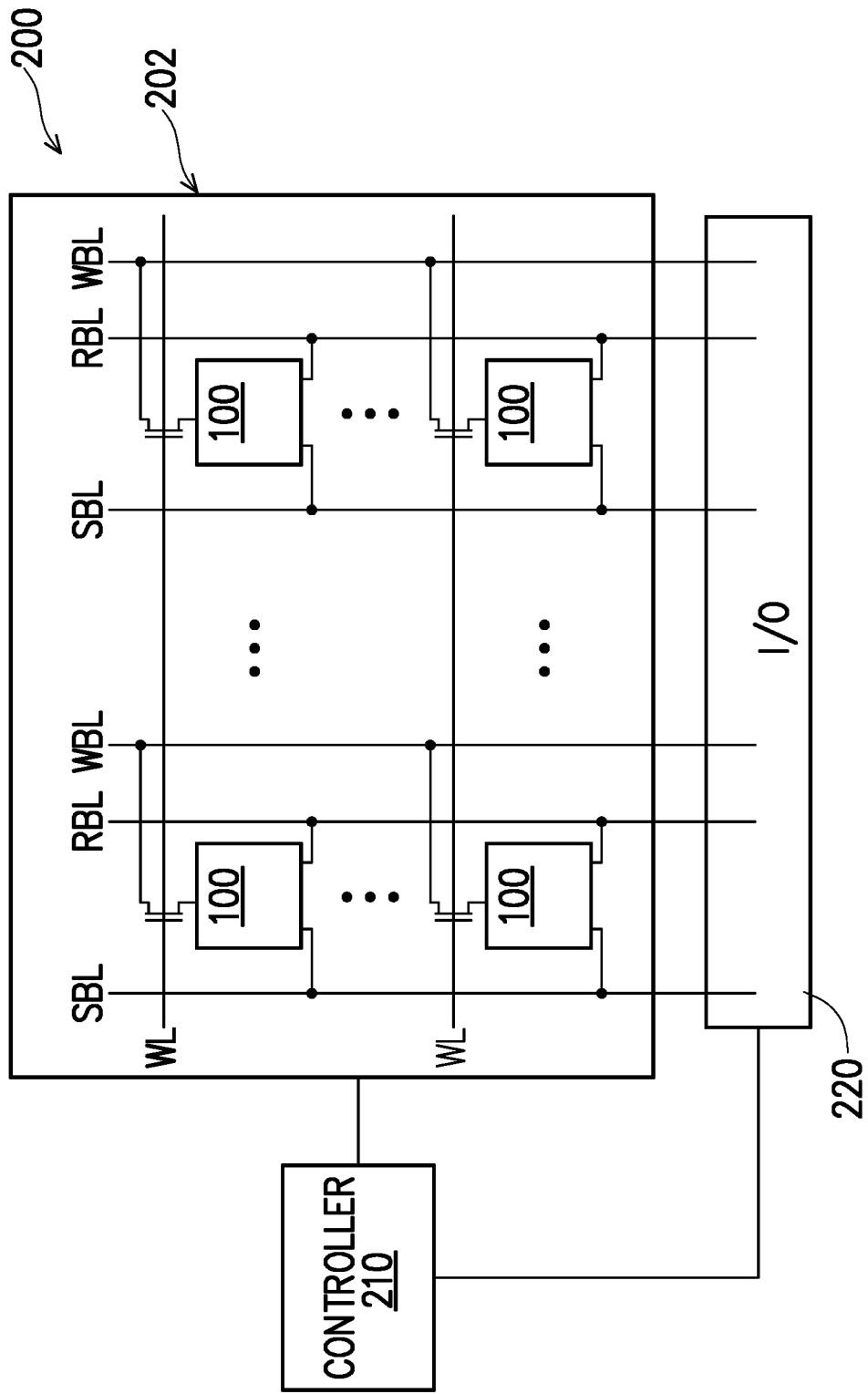
FIG. 16 is a schematic diagram illustrating an example of a memory device that includes multi-bit memory cells such as those shown in FIGS. 1A-1C in accordance with disclosed embodiments.

FIG. 16 illustrates an example of a memory device 200 that has an array 202 of the multiple bit memory cells 100 arranged in rows and columns. Each of the rows has a corresponding word line WL. Each of the columns has a corresponding source bit line SBL, a corresponding read bit line RBL, and a corresponding write bit line WBL. A memory controller 210, which may be implemented by any suitable processing device, is configured to control application of signals to the appropriate word line WL and bit lines SBL, RBL and WBL based on a received memory address. An I/O circuit 220 is connected to the bit lines SBL, RBL and WBL to read and write data from the memory cells 100 in response to the controller 210. Operation of the memory device 200 in accordance with disclosed examples is discussed further below.

Figure 17:
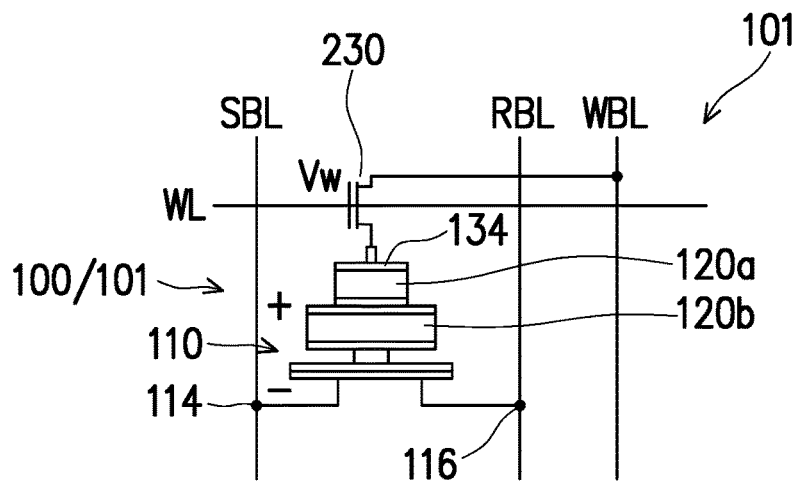
FIG. 17 is a block diagram illustrating further aspects of the memory device shown in FIG. 16 in accordance with disclosed embodiments.

FIG. 17 illustrates further aspects of the memory device 200, where the multi-bit memory cell 100 includes the FeFET 101 discussed above. FIG. 17 illustrates an example of one of the memory cells 100, along with its connections to the word lines WL and bit lines SBL, RBL and WBL. More particularly, one source/drain terminal 114 of the multi-bit memory cell 100 is connected to the source bit line SBL, while the other source/drain terminal 116 is connected to the read bit line RBL. An access transistor 230 is connected between the write bit line WBL and the gate terminal 134. More particularly, each of the memory cells 100 has a respective access transistor 230, where one source/drain terminal of the access transistor 230 is connected to the gate terminal 134 of its respective multi-bit memory cell 100, and the other source/drain terminal is connected to the write bit line WBL of the corresponding column. The gate terminal of the access transistor 230 is connected to the word line WL of the corresponding row of the array 202.

As noted above, the memory cell 100 is a multiple bit memory cell (i.e. able to store multiple bits of data rather than only a single data bit as with conventional memory cells). The multi-bit memory cell 100 includes the FeFET 101, the gate 110 of which has two ferroelectric layers in the example of FIG. 17, where the ferroelectric layers 120a and 120b are configured such that the FeFET 101 has 4 Vt levels, as will be explained further below.

To write to the multi-bit memory cell 100, the corresponding word line WL is on (i.e. logic 1 or high). In the example shown in FIG. 17, the access transistor 230 is an NMOS transistor, so the high word line signal turns the access transistor 230 on, connecting the write bit line WBL to the gate terminal 134 of the FeFET 101. For the write operation, the source bit line SBL and the read bit line RBL are connected to the same potential, while the write bit line WBL is connected to another potential with different polarity. The potential difference between the write bit line WBL and the read and source bit lines RBL/SBL is referred to as the write voltage Vw.

Scanning the write voltage Vw from low to high and high to low can produce the four different threshold states denoted as 00, 01, 10, and 11 shown in the transition state diagram of FIG. 11 discussed above. The four different threshold voltages V00, V01, V10, and V11 correspond to the four different data states 00, 01, 10 and 11 of the two-bit memory cell 100. More particularly, for the FeFET 101 of FIG. 17 that has two ferroelectric layers 120a and 120b, the write voltage Vw has one minimum level Vc1 that will cause the first ferroelectric layer 120a to switch state, and a second minimum level Vc2 that will cause the second ferroelectric layer 120b to switch state.

As noted above, the total potential difference between the write bit line WBL and the read and source bit lines RBL/SBL is the write voltage Vw. The respective voltage drops across the first and second ferroelectric layers 120a and 120b together make up the total write voltage Vw. The respective portions $V_{Fe1}$ and $V_{Fe2}$ of the total write voltage Vw for the ferroelectric layers 120a and 120b may be determined according to the respective capacitances of the first and second ferroelectric layers 120a and 120b as shown below.

$$V_{Fe1} = Vw*C2/(C1+C2) \quad (1)$$

$$V_{Fe2} = Vw*C1/(C1+C2) \quad (2)$$

C1 and C2 are capacitances for the respective first and second ferroelectric layers 120a and 120b and may be calculated as follows.

$$C1 = \epsilon A1/d \quad (3)$$

$$C2 = \epsilon A2/d \quad (4)$$

ϵ is the dielectric constant, A1 and A2 are the areas of the first and second ferroelectric layers 120a and 120b, and d is the thickness (i.e distance between conductive plates) of the first and second ferroelectric layers 120a and 120b. In the illustrated example, the first and second ferroelectric layers 120a and 120b are connected in series, and thus the respective capacitances C1 and C2 are in series. However, other connections of the ferroelectric layers 120a and 120b, such as parallel connections, are within the scope of the disclosure. Since the dielectric constant E and the thickness d is the same for both of the ferroelectric layers 120a and 120b, the capacitance C1 and C2 will vary with the respective areas A1 and A2.

The minimum write voltage Vw levels Vc1 and Vc2 that will cause the respective first and second ferroelectric layers 120a and 120b to switch state may be calculated as follows.

$$Vc1 = Ec1*d*(C1+C2)/C2 \quad (5)$$

$$Vc2 = Ec2*d*(C1+C2)/C1 \quad (6)$$

Ec1 and Ec2 are the switching E fields to write the ferroelectric layers 120a and 120b from a 0 to a 1 state. To switch the ferroelectric layers 120a and 120b from the 1 to the 0 state, −Vc1 and −Vc2 are applied.

Figure 18:
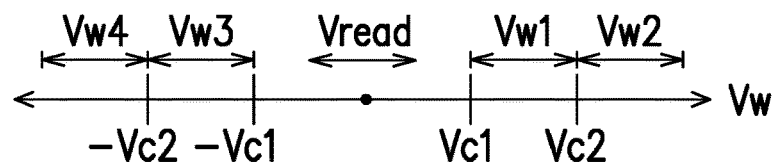
FIG. 18 is a chart illustrating example relationships among memory cell write voltages and minimum switching voltages in accordance with disclosed embodiments.

As such, the gate 110 having the two ferroelectric layers 120a and 120b with different switching E fields has four different states resulting from different voltage levels applied across the gate electrodes 130 and 134. Thus, for the double gate FeFET 101 having the two ferroelectric layers 120a and 120b, there are four different Vw voltages that cause the ferroelectric layers 120a and 120b to switch states: Vw1, Vw2, Vw3 and Vw4. FIG. 18 illustrates relationships among the write voltages Vw1-Vw4 and the switching voltages ±Vc1 and ±Vc2 in accordance with some examples. In the example of FIG. 18, the write voltage Vw1 is greater than Vc1 but less than Vc2 (i.e. Vc1<Vw1<Vc2), and the write voltage Vw2 is greater than Vc2 (i.e. Vw1>Vc2). Further, the write voltage Vw3 is less than −Vc1 but greater than −Vc2 (i.e. −Vc2<Vw3<−Vc1), and the write voltage Vw4 is less than −Vc2 (i.e. Vw4<−Vc2).

In some examples, Vc1 is about ±0.25V, while Vc2 is about ±0.5v. In some implementations, it may be desirable to calculate the write voltages based on relative dimensions of the ferroelectric layers 120a and 120b. For instance, specific write voltages may be calculated based on relative areas A1 and A2 of the first and second ferroelectric layers 120a and 120b, respectively. The area A2 of the second ferroelectric layer 120b may be a factor n (n>0) larger than the area A1 of the first ferroelectric layer 120a, indicated as follows $$A2 = n*A1 \quad (7)$$

If the dielectric constant ϵ and thickness (i.e. distance d) of the ferroelectric layers 120a and 120b is the same, the capacitance of the ferroelectric layers follows the area relationship.

$$C2 = n*C1 \quad (8)$$

The minimum write voltages Vc1 and Vc2 may then be calculated as shown below.

$$Vc1 = Ec1*d*(n+1)/n \quad (9)$$

$$Vc2 = Ec2*d*(n+1) \quad (10)$$

As noted above, E1 and E2 are the E fields for changing the state of (i.e. writing) the respective first and second ferroelectric layers 120a and 120b. Thus, if n=2 (i.e the area of the second ferroelectric layer 120b is twice that of the first ferroelectric layer 12a), $$Vc1 = 1.5Ec1*d \quad (11)$$

$$Vc2 = 3Ec2*d \quad (12)$$

Figure 20:
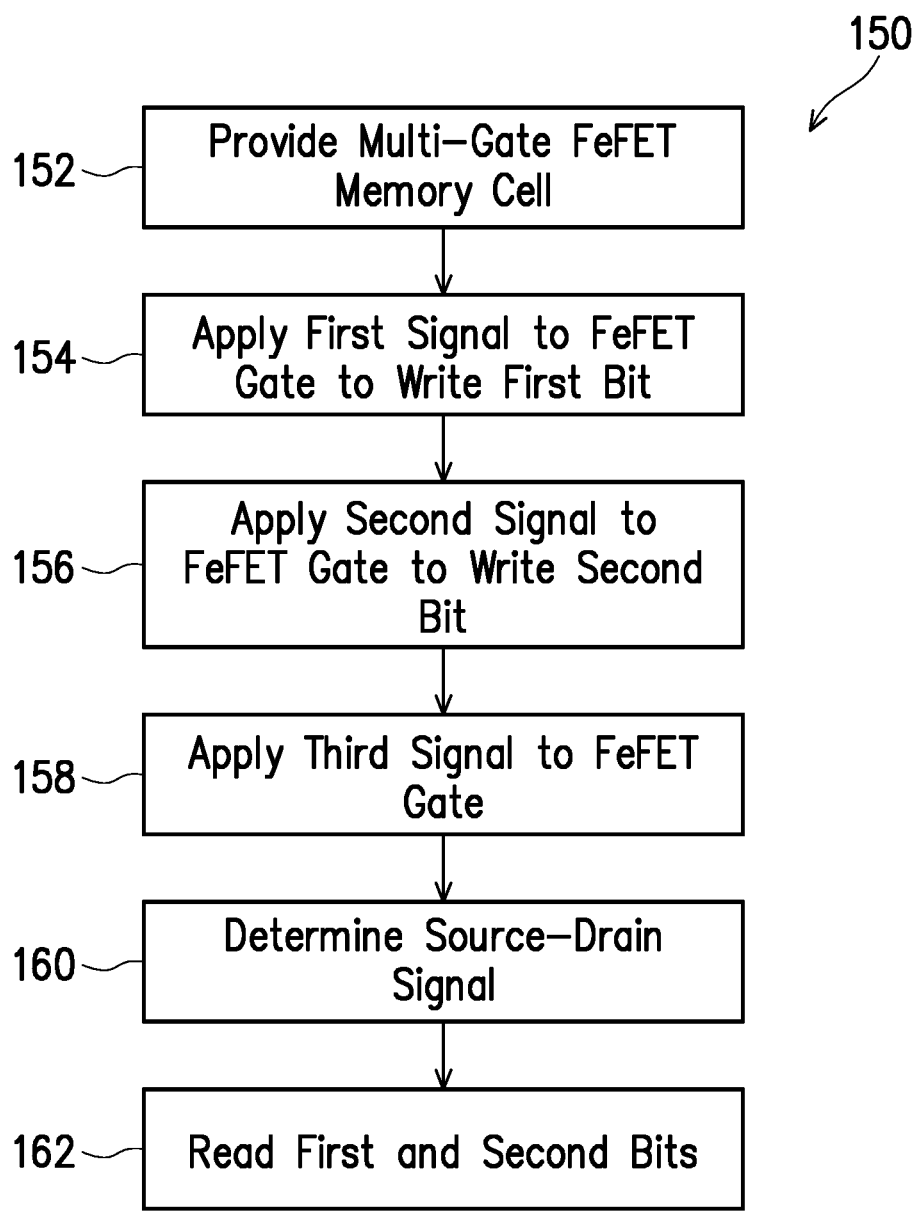
FIG. 20 is a flow diagram illustrating an example method for operating a multi-bit memory cell in accordance with disclosed embodiments.

FIG. 20 is a flow diagram illustrating a general method 150 for writing data to a multi-gate FeFET memory cell, such as the memory cell 100 disclosed above. At step 152, a memory cell is provided, such as the multi-bit memory cell 100. The provided memory cell includes the multi-gate FeFET 101, which includes a source, a drain and a gate. At step 154, a first predetermined signal, such as the Vw1 write voltage, is applied to the gate to write a first data value to a bit (e.g. 01) of the multi-bit memory cell 100. At step 156, a second predetermined signal, such as the Vw2 write voltage, is applied to the gate to write a second bit (e.g. 11) of the memory cell.

Figure 19:
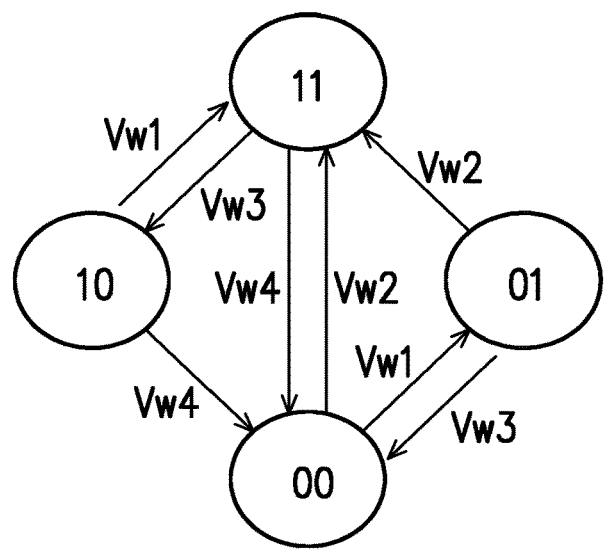
FIG. 19 is a chart illustrating example switching transitions of ferroelectric layers corresponding to write voltages shown in FIG. 18 in accordance with disclosed embodiments.

More particularly, the possible switching transitions of the ferroelectric layers 120a and 120b for the write voltages Vw1-Vw4 are shown in FIG. 19. In the 00 state, both the first and second ferroelectric layers 120a and 120b are in the 0 state. Applying the write voltage Vw1 (i.e. greater than Vc1 but less than Vc2) to the write bit line WBL results in the first ferroelectric layer 120a changing from the 0 state to the 1 state, while the state of the second ferroelectric layer remains unchanged. Thus, the double gate memory cell 100 in the 00 state transitions to the 01 state. Applying the write voltage Vw2 (i.e. greater than Vc2) to the write bit line WBL results in the second ferroelectric layer 120b changing from the 0 state to the 1 state, so the double gate memory cell 100 in the 01 state transitions to the 11 state. However, since the Vw2 write voltage is higher than the both the Vc1 and Vc2 voltage levels, applying the Vw2 write voltage to the WBL will cause both ferroelectric layers 120a and 120b to transition from 0 to 1. Thus, when the memory cell 100 is in the 00 state, applying the Vw2 voltage to the WBL will cause both ferroelectric layers 120a and 120b to switch to the 11 state, writing the memory cell directly from the 00 state to the 11 state.

Applying the write voltage Vw3 (i.e. less than −Vc1 but greater than −Vc2) to the write bit line WBL results in the first ferroelectric layer 120a changing from the 1 state to the 0 state, while the state of the second ferroelectric layer remains unchanged. Thus, the double gate memory cell 100 in the 11 state transitions to the 10 state. Applying the write voltage Vw4 (i.e. less than −Vc2) to the write bit line WBL results in the second ferroelectric layer 120b changing from the 1 state to the 0 state, so the double gate memory cell 100 in the 10 state transitions to the 00 state. However, since the Vw4 write voltage is lower than the both the −Vc1 and −Vc2 voltage levels, applying the Vw4 write voltage to the WBL will cause both ferroelectric layers 120a and 120b to transition from 1 to 0. Thus, when the memory cell 100 is in the 11 state, applying the Vw4 voltage to the WBL will cause both ferroelectric layers 120a and 120b to switch to the 00 state, writing the memory cell directly from the 11 state to the 00 state.

Moreover, applying the Vw3 write voltage to the WBL when the memory cell 100 is in the 01 state will cause the first ferroelectric layer 120a to transition to the 0 state, thus writing the memory cell 100 from the 01 state to the 00 state. Similarly, applying the Vw1 write voltage to the WBL when the memory cell 100 is in the 10 state will cause the first ferroelectric layer 120a to transition to the 1 state, thus writing the memory cell 100 from the 10 state to the 11 state.

Referring back to FIG. 20, the method 150 further includes applying a third predetermined signal to the gate at step 158 for a data read process. In step 160, a signal between the FeFET source and drain is determined, and the data stored in the memory cell 100 is determined based thereon in step 162.

More particularly, to read data from the double gate memory cell 100, the signal on the wordline WL is high, turning on the access transistor 230. A read voltage Vread is applied to the write bit line WBL and thus to the gate 110 of the FeFET 101. In some examples, the read voltage Vread is between −Vc1 and Vc1 as shown in FIG. 18. A voltage or current passing between the read bit line RBL and the source bit line SBL will vary according to the four different Vt states (see FIG. 11). Reading the resulting current or voltage using a multiple bit sense amplifier included in the I/O circuit 220 derives the 2 bits of data from the double gate memory cell 100.

As discussed above, the unique switching E fields for the ferroelectric layers 120a and 120b may be achieved by varying the surface area of the ferroelectric layers 120a and 120b. Alternative embodiments may achieve unique switching E fields for each of the ferroelectric layers 120a and 120b by varying other factors. For example, in some embodiments the area of the ferroelectric layers 120a and 120b may be the same while the dielectric constant of the ferroelectric layers 120a and 120b is varied to achieve respective different switching E fields for the ferroelectric layers 120a and 120b.

In general, a ferroelectric layer having a lower dielectric constant will have a larger voltage drop, and thus have a higher switching E field than a ferroelectric layer having a larger dielectric constant. For example, if the two ferroelectric layers 120a and 120b have the same thickness d (i.e. vertical dimension as shown in FIGS. 8 and 9) and also have the same surface area, but have different dielectric constants, the layer having the lower dielectric constant will switch first—i.e., at a lower write voltage Vw. To switch the layer with the higher dielectric constant, a stronger voltage is applied across the gate terminals 130 and 134. Since the different ferroelectric layers switch in response to different applied voltages (i.e. resulting from different switching E fields), the multi-gate FeFET 101 will demonstrate multiple threshold voltages as described above.

Figure 21:
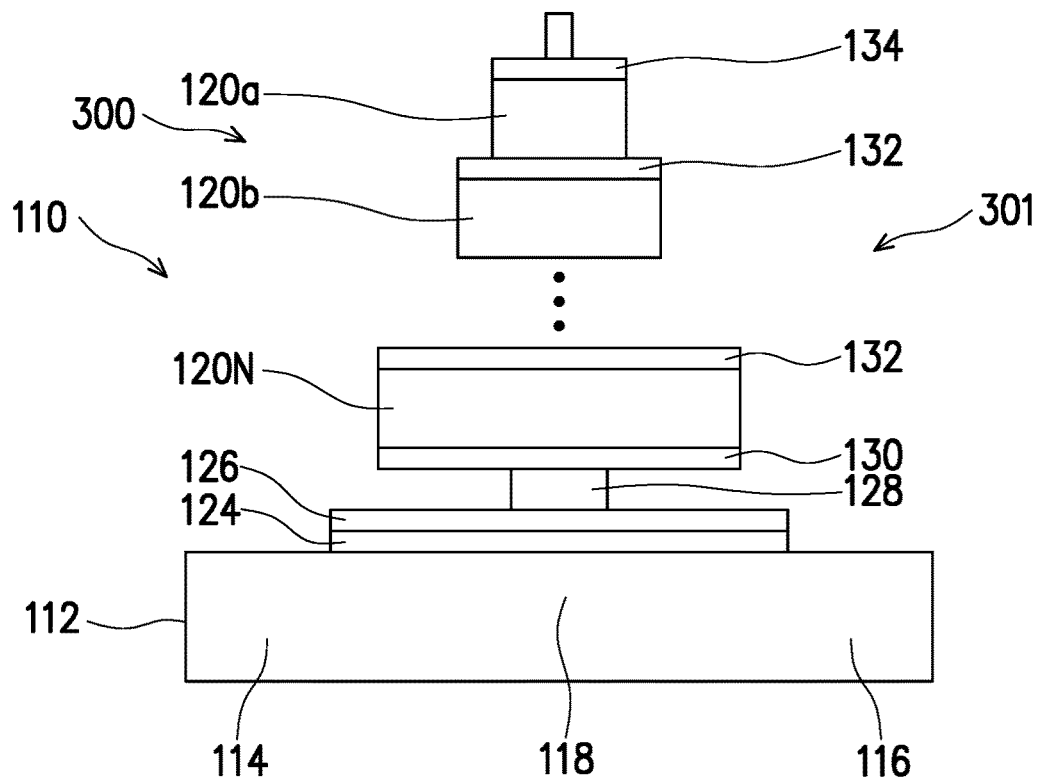
FIG. 21 is a block diagram schematically illustrating a generalized example of a multi-bit memory cell in accordance with disclosed embodiments.

FIG. 21 illustrates a generalized case of a memory cell 300 in accordance with disclosed examples. As with the embodiment shown in FIG. 1, the memory cell 300 includes a multi-gate FeFET 301 having N ferroelectric layers (N is a positive integer greater than 1), including ferroelectric layers 120a, 120b . . . 120N. The example shown in FIG. 21 has the N ferroelectric layers arranged in a stacked configuration with the size (i.e. surface area) of the ferroelectric layers getting larger from top to bottom. Other configurations are within the scope of this disclosure.

In the FeFET 101 of the multi-bit memory cell 100 shown in FIG. 1, N=2. As with the FeFET 101 shown in FIG. 1, the gate 110 of the FeFET 301 shown in FIG. 21 includes a plurality of ferroelectric layers configured such that each of the ferroelectric layers has a respective unique switching E-field. The ferroelectric layers are arranged in a stacked arrangement, and a gate metal layer 130 abuts one side of the bottommost ferroelectric layer 120N and is connected to a gate electrode 126 by a via 128. Buffer layers 132 are situated between the each of the adjacent ferroelectric layers 120a, 120b N, and a conductive gate terminal 134 is situated on the uppermost ferroelectric layer 120a.

As with the multi-bit memory cell 100, the memory cell 300 has a substrate 112 that may be, for example, a semiconductor layer of a semiconductor-on-insulator (SOI) substrate or a bulk semiconductor substrate. The FeFET 301 comprises a pair of source/drain regions 114, 116 that have a first doping type and are arranged within the substrate 112, respectively on opposite sides of a channel region 118. The channel region 118 has a second doping type opposite the first doping and is arranged in the substrate 112 laterally between the source/drain regions 114, 116. The first and second doping types may, for example, respectively be n-type and p-type, or vice versa.

The gate 110 has a gate metal layer 126 arranged over the substrate 112 laterally between the source/drain regions 114, 116, and is spaced from the substrate 112 by a non-ferroelectric gate oxide 124. In some examples, the non-ferroelectric gate oxide material is silicon dioxide. The ferroelectric layers 120a, 120b . . . 120N may alternatively be formed directly over the non-ferroelectric gate oxide 124 to form a composite gate structure. The gate electrode 126 is conductive and may comprise metal, doped polysilicon, or a combination thereof. In the illustrated embodiment, the gate electrode 126 is electrically coupled to the ferroelectric layers by a conductive via 128.

Figure 22:
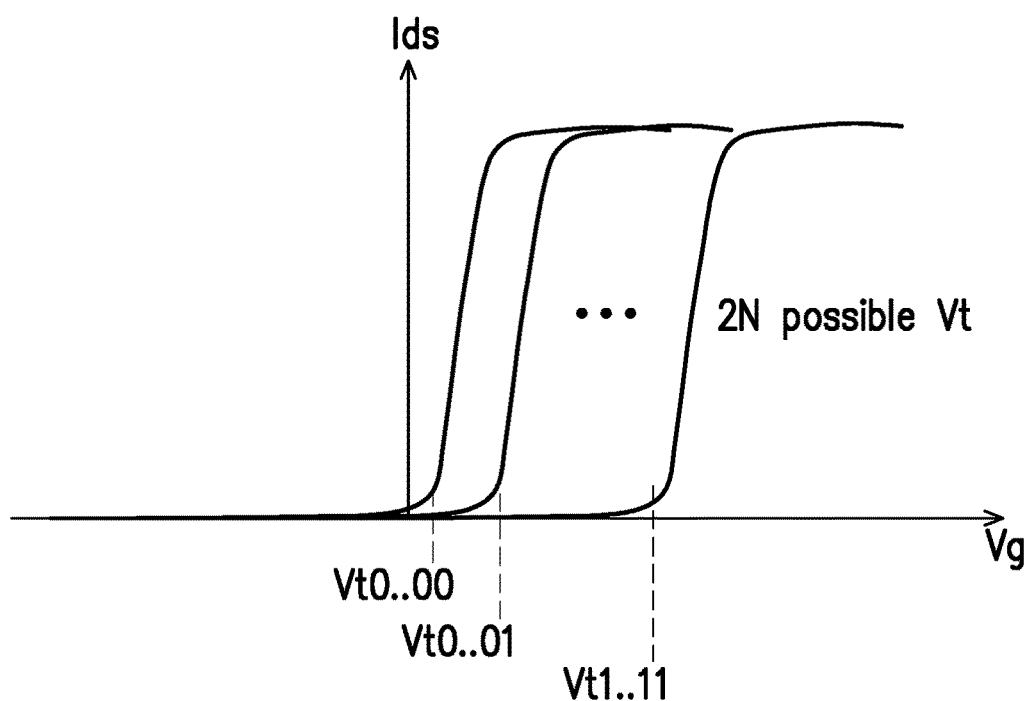
FIG. 22 is a chart illustrating Vt levels for the generalized multi-bit memory cell of FIG. 21 in accordance with disclosed embodiments.

As shown in FIG. 22, the generalized multi-bit FeFET 301 having N ferroelectric layers will exhibit 2N threshold voltages Vt. Further, the generalized multi-bit FeFET 301 having N ferroelectric layers has a maximum number of data bits according to $\log_2(2N)$. The example discussed above in conjunction with FIG. 1A has two ferroelectric layers 120a and 120b, and thus N=2. Accordingly, the FeFET 101 exhibits four (i.e. 2N=4) threshold voltages Vt as shown in FIG. 11, and can write two data bits (i.e. $\log_2(2N)$=2).

Figure 23:
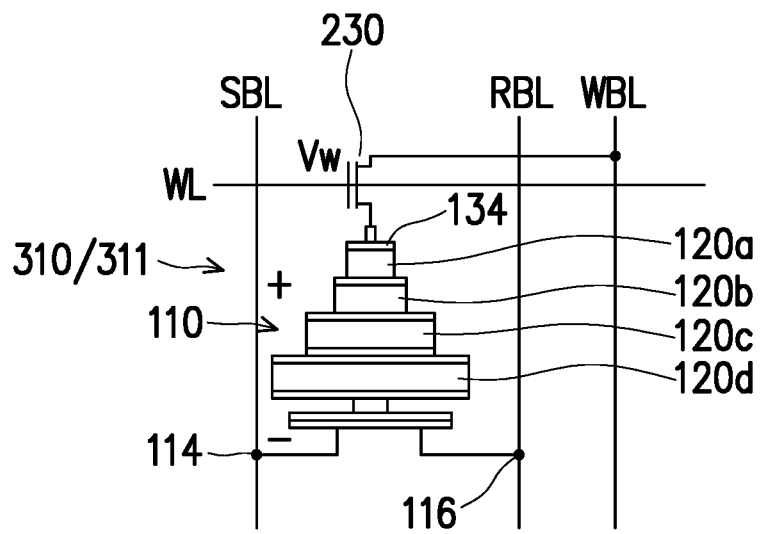
FIG. 23 is a block diagram schematically illustrating a quadruple gate multi-bit memory cell in accordance with disclosed embodiments.
Figure 24:
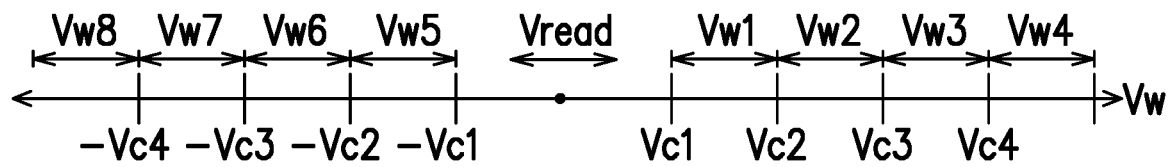
FIG. 24 is a chart illustrating example relationships among memory cell write voltages and minimum switching voltages for the multi-bit memory cell of FIG. 23 in accordance with disclosed embodiments.
Figure 25:
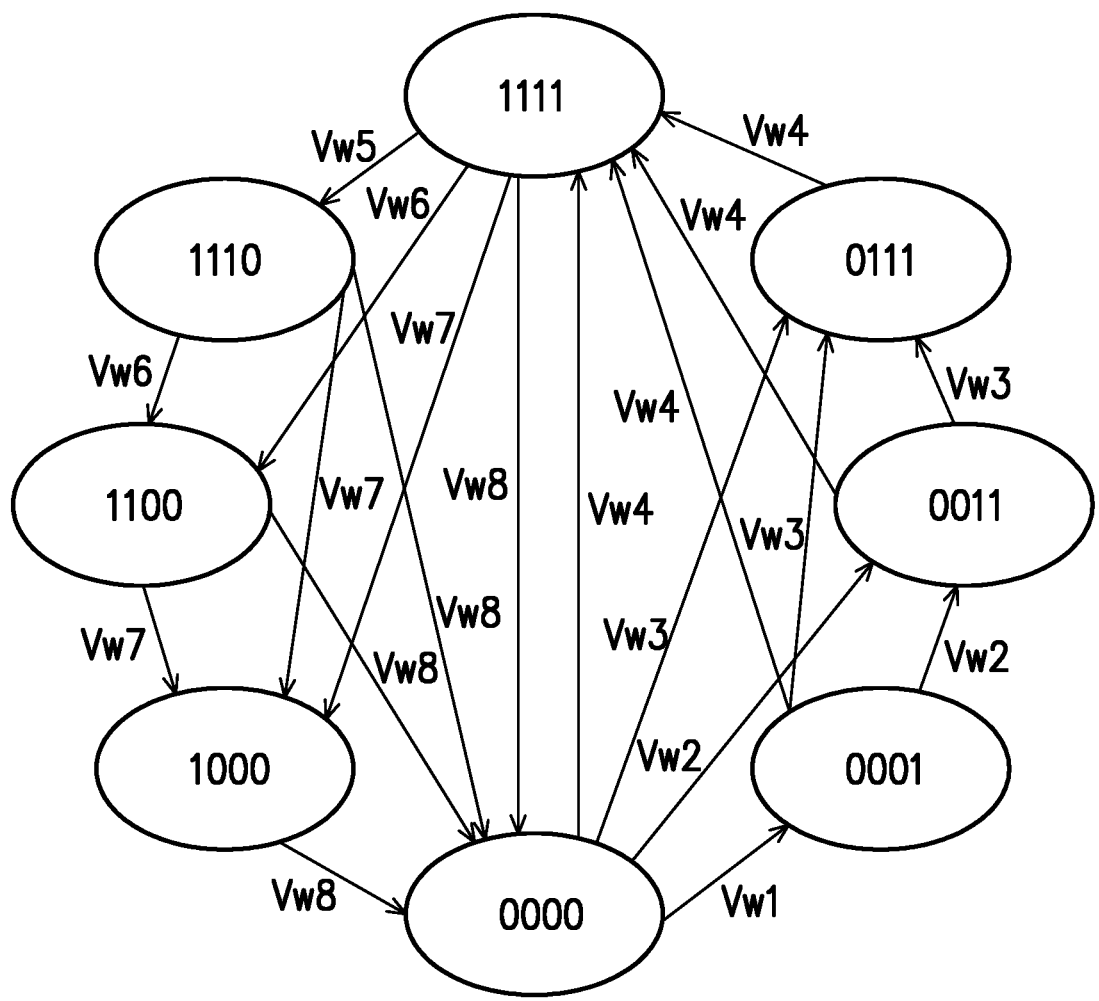
FIG. 25 is a chart illustrating example switching transitions of ferroelectric layers corresponding to write voltages shown in FIG. 24 in accordance with disclosed embodiments.

FIGS. 23-25 illustrate aspects of another example memory cell 310 applying the general case 300 shown in FIG. 21. The memory cell 310 includes a multi-bit FeFET 311 having 4 ferroelectric layers 120a-120d. In other words, N=4. As with the earlier described embodiments, the four ferroelectric layers 120a-120d are arranged in a stacked configuration with the size (i.e. surface area) of the ferroelectric layers getting larger from top to bottom. Other configurations are within the scope of this disclosure.

As with the previous examples, the FeFET 311 shown in FIG. 23 has ferroelectric layers 120a-120d configured such that each has a respective unique switching E-field. The FeFET 311 of the memory cell 310 has one source/drain terminal 114 connected to the source bit line SBL, while the other source/drain terminal 116 is connected to the read bit line RBL. An access transistor 230 is connected between the write bit line WBL and the gate terminal 134. More particularly, one source/drain terminal of the access transistor 230 is connected to the gate terminal 134 of its respective memory cell 310, and the other source/drain terminal is connected to the write bit line WBL of the corresponding column. The gate terminal of the access transistor 230 is connected to the word line WL of the corresponding row of the array 202.

As noted above, the multi-bit FeFET 311 having N ferroelectric layers will exhibit 2N threshold voltages Vt. Accordingly, the memory cell 310 having the FeFET 311 has eight Vt levels, and thus has eight minimum write voltages levels ±Vc1-Vc4 (i.e., the voltages that cause the ferroelectric layers ferroelectric 120a-120d to switch between the 0 and 1 state). FIG. 24 illustrates relationships among the switching voltages ±Vc1, ±Vc2, ±Vc3 and ±Vc4 and write voltages Vw1-Vw8 for the memory cell 310. In the example of FIG. 24, the write voltage Vw1 is greater than Vc1 but less than Vc2 (i.e. Vc1<Vw1<Vc2), the write voltage Vw2 is greater than Vc2 but less than Vc3 (i.e. Vc2<Vw2<Vc3), the write voltage Vw3 is greater than Vc3 but less than Vc4 (i.e. Vc3<Vw3<Vc4), and the write voltage Vw4 is greater than Vc4 (i.e. Vw4>Vc4). Further, the write voltage Vw5 is less than -Vc1 but greater than -Vc2 (i.e. -Vc2<Vw5<-Vc1), the write voltage Vw6 is less than -Vc2 but greater than -Vc3 (i.e. -Vc3<Vw6<-Vc2), the write voltage Vw7 is less than -Vc3 but greater than -Vc4 (i.e. -Vc4<Vw7<-Vc3), and the write voltage Vw8 is less than -Vc4 (i.e. Vw8<-Vc4).

The Vc1-Vc4 voltages may be calculated as follows.

$$Vc1 = Ec1 * d * (C1C2C3 + C1C2C4 + C1C3C4 + C2C3C4)/C2C3C4 \quad (13)$$

$$Vc2 = Ec2 * d * (C1C2C3 + C1C2C4 + C1C3C4 + C2C3C4)/C1C3C4 \quad (14)$$

$$Vc3 = Ec3 * d * (C1C2C3 + C1C2C4 + C1C3C4 + C2C3C4)/C1C2C4 \quad (15)$$

$$Vc4 = Ec4 * d * (C1C2C3 + C1C2C4 + C1C3C4 + C2C3C4)/C1C2C3 \quad (16)$$

Ec1-4 are the respective switching E fields to write the ferroelectric layers 120a-120d from a 0 to a 1 state, C1-C4 are the capacitances of the ferroelectric layers 120a-12d and d is the ferroelectric layer thickness.

If C4=4C1, C3=3C1, C2=2C1, then the minimum Vc1-Vc4 voltage levels may be calculated according to equations (9) and (10) as follows $$Vc1 = 50/24 * Ec * d$$

$$Vc2 = 2 * Vc1$$

$$Vc3 = 3 * Vc1$$

$$Vc4 = 4 * Vc1$$

Switching transitions of the ferroelectric layers 120a-120d for the write voltages Vw1-Vw8 are shown in FIG. 25. In the 0000 state, all of the ferroelectric layers 120a-120d and 120b are in the 0 state. Applying the write voltage Vw1 (i.e. greater than Vc1 but less than Vc2) to the write bit line WBL results in the first ferroelectric layer 120a changing from the 0 state to the 1 state, while the states of the ferroelectric layers 120b-120d remain unchanged. Thus, the quadruple gate memory cell 310 in the 0000 state transitions to the 0001 state. Applying the write voltage Vw2 (i.e. greater than Vc1 and Vc2 but less than Vc3) to the write bit line WBL results in the second ferroelectric layer 120b changing from the 0 state to the 1 state, so the memory cell 310 in the 0001 state transitions to the 0011 state. However, since the Vw2 write voltage is higher than the both the Vc1 and Vc2 voltage levels, applying the Vw2 write voltage to the WBL will cause both ferroelectric layers 120a and 120b to transition from 0 to 1. Thus, when the memory cell 310 is in the 0000 state, applying the Vw2 voltage to the WBL will cause both ferroelectric layers 120a and 120b to switch to the 11 state, writing the memory cell directly from the 0000 state to the 0011 state.

Applying the write voltage Vw3 (i.e. greater than Vc1, Vc2 and Vc3 but less than Vc4) to the write bit line WBL results in the third ferroelectric layer 120c changing from the 0 state to the 1 state, while the state of the ferroelectric layer 120d remains unchanged. Thus, the memory cell 310 in any of the 0000, 0001, 0011 states will transition to the 0111 state. Applying the write voltage Vw4 (i.e. greater than Vc1, Vc2, Vc3 and Vc4) to the write bit line WBL results in the ferroelectric layer 120d changing from the 0 state to the 1 state, so the memory cell 310 in any of the 0000, 0001, 0011, and 0111 states transitions to the 1111 state.

Applying the write voltage Vw5 (i.e. less than -Vc1 but greater than -Vc2) to the write bit line WBL results in the first ferroelectric layer 120a changing from the 1 state to the 0 state, while the states of the ferroelectric layers 120b-120d remains unchanged. Thus, the memory cell 310 in the 1111 state transitions to the 1110 state. Applying the write voltage Vw6 (i.e. less than −Vc1 and −Vc2 but greater than −Vc3) to the write bit line WBL results in the second ferroelectric layer 120b changing from the 1 state to the 0 state, so the memory cell 310 in the 1110 state transitions to the 1100 state. Since the Vw6 write voltage is less than the both the −Vc1 and −Vc2 voltage levels, applying the Vw6 write voltage to the WBL will cause both ferroelectric layers 120a and 120b to transition from 1 to 0, so that when the memory cell 310 is in the 1111 state, applying the Vw6 voltage to the WBL will cause both ferroelectric layers 120a and 120b to switch to the 0 state, writing the memory cell directly from the 1111 state to the 1100 state.

Applying the write voltage Vw7 (i.e. less than −Vc1, −Vc2 and −Vc3 but greater than −Vc4) to the write bit line WBL results in the third ferroelectric layer 120c changing from the 1 state to the 0 state, while the state of the ferroelectric layer 120d remains unchanged. Thus, the memory cell 310 in any of the 1111, 1110, 1100 states will transition to the 1000 state. Applying the write voltage Vw8 (i.e. less than −Vc1, −Vc2, −Vc3 and −Vc4) to the write bit line WBL results in the ferroelectric layer 120d changing from the 1 state to the 0 state, so the memory cell 310 in any of the 1000, 1110, 1100, and 1000 states transitions to the 0000 state.

Reading data from the quadruple gate memory cell 310 follows the same process as described above for the double gate memory cell 100. The signal on the word line WL is high, turning on the access transistor 230. A read voltage Vread is applied to the write bit line WBL and thus to the gate 110 of the FeFET 311. In some examples, the read voltage Vread is between −Vc1 and Vc1 as shown in FIG. 24. A voltage or current passing between the read bit line RBL and the source bit line SBL will vary according to the eight different Vt states of the memory cell 310. Reading the resulting current or voltage using a multiple bit sense amplifier included in the I/O circuit 220 derives the 3 bits of data from the quadruple gate memory cell 310.

Disclosed embodiments provide a non-volatile memory cell that is configured to store multiple bits of data, thus reducing space requirements for a memory device. Such multi-bit memory cells include a multiple gate FeFET structure that has a plurality of ferroelectric layers that each exhibit a respective unique switching E-field. Accordingly, the multi-bit memory cell exhibits more threshold voltage Vt values than a conventional FeFET memory cell.

More particularly, disclosed embodiments include a memory device having a plurality of memory cells. Each memory cell includes a multi-gate FeFET that has a first source/drain terminal, a second source/drain terminal, and a gate with a plurality of ferroelectric layers configured such that each of the ferroelectric layers has a respective unique switching E-field.

In accordance with further embodiments, a memory device includes an array of multi-bit memory cells arranged in rows and columns. Each of the rows has a corresponding word line, and each of the columns has a corresponding source bit line, a corresponding read bit line, and a corresponding write bit line. A plurality of access transistors each have a first source/drain terminal connected to a respective one of the multi-bit memory cells, a second source/drain terminal connected to the write bit line of the corresponding column, and a gate terminal connected to the word line of a corresponding row. Each of the multi-bit memory cells includes a FeFET having a first source/drain terminal coupled to the source bit line of the corresponding column, a second source/drain terminal coupled to the read bit line of the corresponding column, and a gate comprising N ferroelectric layers (N is a positive integer greater than 1). The N ferroelectric layers are configured such that the FeFET has 2N threshold voltage (Vt) levels.

In accordance with still further examples, a method includes providing a memory cell including a multi-gate FeFET that has a source, a drain and a gate. A first predetermined signal is applied to the gate to write a first data value to a first bit of the memory cell. A second predetermined signal is applied to the gate to write the first data value to a second bit of the memory cell.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device including a plurality of memory cells, each memory cell comprising:
 a multi-gate ferroelectric gate Field Effect Transistor (FeFET) comprising:
 a substrate defining first and second source/drain regions having a first doping type, and a channel region having a second doping type opposite the first doping type situated between the first and second source/drain regions;
 a first source/drain terminal electrically connected to the first source/drain region;
 a second source/drain terminal electrically connected to the second source/drain region;
 a gate electrode arranged over the channel region;
 a back end of the line (BEOL) ferroelectric gate structure over the gate electrode including:
 a plurality of ferroelectric layers including a first ferroelectric layer and a second ferroelectric layer arranged in a stacked configuration;
 a first conductive gate layer abutting a first side of the first ferroelectric layer, the first side of the first ferroelectric layer having a first surface area;
 a buffer layer between a second side of the first conductive gate layer and a first side of the second ferroelectric layer, the first side of the second ferroelectric layer having a second surface area that is different from the first surface area;
 a second conductive gate layer arranged on the second side of the second ferroelectric layer; and
 a non-ferroelectric gate oxide positioned between the gate electrode and the substrate.

2. The memory device of claim 1, wherein each of the ferroelectric layers has one of a different surface area or a different dielectric constant.

3. The memory device of claim 1, wherein the buffer layer is electrically conductive.

4. The memory device of claim 1, wherein the buffer layer is electrically non-conductive insulating.

5. The memory device of claim 1, wherein the ferroelectric layers are electrically connected in series.

6. The memory device of claim 1, wherein the plurality of ferroelectric layers comprises N ferroelectric layers, where N is a positive integer, and wherein the FeFET has 2N threshold voltage (Vt) levels.

7. The memory device of claim 1, further comprising a second gate metal layer arranged between the non-ferroelectric gate oxide and the second ferroelectric layer, the second gate metal layer arranged on the non-ferroelectric gate oxide.

8. A memory device including a plurality of memory cells, each memory cell comprising:
   a multi-gate ferroelectric gate Field Effect Transistor (FeFET) comprising:
   a substrate defining first and second source/drain regions having a first doping type, and a channel region having a second doping type opposite the first doping type situated between the first and second source/drain regions;
   a first source/drain terminal electrically connected to the first source/drain region;
   a second source/drain terminal electrically connected to the second source/drain region;
   a back end of the line (BEOL) ferroelectric gate structure over the gate electrode including:
   a plurality of ferroelectric layers arranged in a stacked configuration, including:
   a shaped ferroelectric layer having a first thickness and defining a plurality of fin structures; and
   a planar ferroelectric layer having a second thickness different from the first thickness;
   a first conductive gate layer abutting a first side of the shaped ferroelectric layer; and
   a buffer layer between the shaped ferroelectric layer and the planar ferroelectric layer;
   a second conductive gate layer arranged on the second side of the planar ferroelectric layer; and
   a non-ferroelectric gate oxide positioned between the gate electrode and the substrate.

9. The memory device of claim 8, wherein each of the ferroelectric layers has a different surface area.

10. The memory device of claim 8, wherein each of the ferroelectric layers has a different dielectric constant.

11. The memory device of claim 8, wherein the buffer layer is electrically conductive.

12. The memory device of claim 8, wherein the buffer layer is electrically non-conductive insulating.

13. The memory device of claim 8, wherein the ferroelectric layers are electrically connected in series.

14. The memory device of claim 8, wherein the plurality of ferroelectric layers comprises N ferroelectric layers, where N is a positive integer, and wherein the FeFET has 2N threshold voltage (Vt) levels.

15. The memory device of claim 8, further comprising a second gate metal layer arranged between the non-ferroelectric gate oxide and the plurality of ferroelectric layers, the second gate metal layer arranged on the non-ferroelectric gate oxide.

16. A multi-gate ferroelectric gate Field Effect Transistor (FeFET) capable of storing four distinct threshold voltage (Vt) states, the FeFET comprising:
   a source-drain conduction region;
   a via coupled to the source-drain conduction region;
   at least two capacitors separated from the source-drain region by the via, each of the at least two capacitors comprising:
   a buffer layer,
   a conductive gate terminal,
   a dielectric ferroelectric layer arranged between the buffer layer and the conductive gate terminal, and
   a non-ferroelectric gate oxide positioned between the conductive gate terminal and the substrate,
   wherein each of the at least two capacitors has a respective unique switching E-field such that applying a predetermined signal to through the via stores a Vt of the four distinct Vt states.

17. The memory device of claim 16, wherein each of the ferroelectric layers has one of a different surface area or a different dielectric constant.

18. The memory device of claim 16, wherein the ferroelectric layers are electrically connected in series.

19. The memory device of claim 16, wherein the plurality of ferroelectric layers comprises N ferroelectric layers, where N is a positive integer, and wherein the FeFET has 2N threshold voltage (Vt) levels.

20. The memory device of claim 16, further comprising a second gate metal layer arranged between the non-ferroelectric gate oxide and the second ferroelectric layer, the second gate metal layer arranged on the non-ferroelectric gate oxide.

* * * * *